(12) United States Patent
Sethi et al.

(10) Patent No.: US 9,735,300 B2
(45) Date of Patent: Aug. 15, 2017

(54) THERMAL MANAGEMENT

(71) Applicant: SunPower Corporation, San Jose, CA (US)

(72) Inventors: Sunny Sethi, San Bruno, CA (US); David Okawa, Belmont, CA (US)

(73) Assignee: SunPower Corporation, San Jose, CA (US)

(*) Notice: Subject to any disclaimer, the term of this patent is extended or adjusted under 35 U.S.C. 154(b) by 220 days.

(21) Appl. No.: 14/673,733

(22) Filed: Mar. 30, 2015

(65) Prior Publication Data

US 2015/0280038 A1    Oct. 1, 2015

Related U.S. Application Data

(60) Provisional application No. 61/972,156, filed on Mar. 28, 2014.

(51) Int. Cl.
*H01L 31/052* (2014.01)
*F28F 3/06* (2006.01)

(52) U.S. Cl.
CPC ............ *H01L 31/052* (2013.01); *Y02E 10/50* (2013.01)

(58) Field of Classification Search
CPC .................................. F28F 3/06; H01L 31/052
See application file for complete search history.

(56) References Cited

U.S. PATENT DOCUMENTS

| 2003/0116304 A1* | 6/2003 | Ho | H01L 23/3672 |
| | | | 165/80.3 |
| 2006/0137733 A1 | 6/2006 | Schripsema et al. | |
| 2007/0272295 A1 | 11/2007 | Rubin et al. | |
| 2010/0043871 A1* | 2/2010 | Xia | H01L 31/049 |
| | | | 136/251 |
| 2011/0132431 A1* | 6/2011 | Linderman | H01L 31/02021 |
| | | | 136/246 |
| 2011/0240098 A1 | 10/2011 | Corrales et al. | |
| 2011/0297361 A1 | 12/2011 | Carbone et al. | |

FOREIGN PATENT DOCUMENTS

WO    WO2008/143482    11/2008

OTHER PUBLICATIONS

International Search Report for PCT Application No. PCT/US2015/022690, filed Mar. 26, 2015.
International Search Report for PCT Application No. PCT/US2015/023423, filed Mar. 30, 2015.

* cited by examiner

*Primary Examiner* — Magali P Slawski
(74) *Attorney, Agent, or Firm* — Oblon, McClelland, Maier & Neustadt, L.L.P.

(57) ABSTRACT

A solar energy receiver can include a heat sink configured to cool or otherwise dissipate heat. The heat sink can include a plurality of fin members, each having bases that are generally aligned with each other. The bases of the fin members can be connected to one another with connection devices that are spaced away from the bases, so as to improve thermal conductivity performance characteristics.

17 Claims, 7 Drawing Sheets

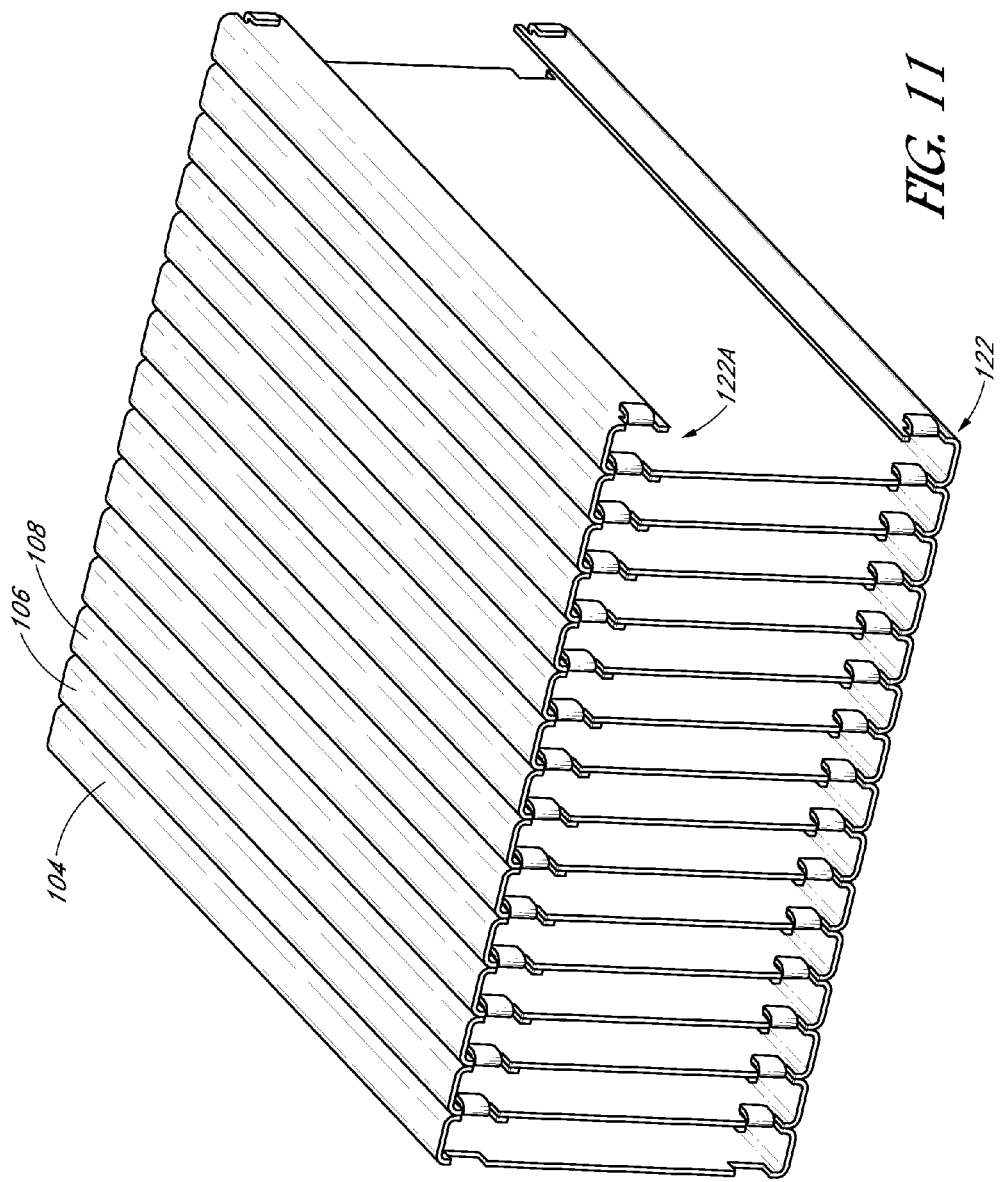

THERMAL MANAGEMENT

CROSS REFERENCE TO RELATED APPLICATION

This application claims the benefit of U.S. Provisional Application No. 61/972,156 filed Mar. 28, 2014, entitled "Thermal Management" by Sunny Sethi et al., the entire contents of which are hereby incorporated by reference.

TECHNICAL FIELD

Embodiments of the subject matter described herein relate generally to photovoltaic assemblies including solar cell assemblies, photovoltaic modules and associated electronic components such as, for example, heat sinks.

BACKGROUND

Solar cells (a.k.a. photovoltaic cells) are widely used for converting solar radiation to electrical energy. Several solar cells can be connected together to form a solar cell array. Such a solar cell array can be packaged into a photovoltaic (PV) module using various processes and encapsulate materials.

Electronic components and wiring are used to convert, gather, and transfer the generated electric current. During operation, some of the electronic components can generate or trap heat which can cause accelerated degradation of such components. Further, excessive heat can also permanently damage photovoltaic cells and/or cause temporary performance degradation.

Some known photovoltaic systems operate on principles, commonly referred to as "concentrated PV" in which optical elements are used to concentrate sunlight onto photovoltaic receivers. Such use of concentrated sunlight can exacerbate some thermal management related issues.

SUMMARY

An aspect of at least one of the embodiments disclosed herein includes the realization that cooling devices, such as heat sinks, can be improved and constructed at a reduced cost.

For example, in some known designs, a heat sink is constructed using a plurality of generally L-shaped fins which are interconnected using a "zippered" configuration. More specifically, the base of each fin includes a planar fin portion joined to a planar base portion, typically with a 90 degree bend. The portion of the fin forming the 90 degree bend includes a plurality of apertures which partially define a zippered interconnection between adjacent fins. The free edge of the base portion includes a plurality of projections configured to align with and extend into the plurality of apertures on an adjacent fin. With a plurality of such fins connected to each other with the projections and apertures aligned, the bases can be aligned in generally a coplanar configuration.

In the environment of use of a PV collector, the fin array can be connected to a solar cell using a thermally conductive material which can be in the form of a flowable and curable material. In some environments of use, such as PV collectors, an additional layer of metal is bonded to the bases of the fin array and the opposite side of the additional layer of metal is thermally connected to the solar cell. The additional layer of metal adds cost in terms of material and additional labor required for assembly of such a device.

It has been discovered that elimination of the additional layer of metal causes a failure known as "partial discharge failure". An aspect of at least one of the embodiments disclosed herein includes the realization that the partial discharge failures of the "zippered" design noted above can be reduced or eliminated by eliminating mechanical engagement features on a fin in the vicinity of the bases of the fins.

Thus, in accordance with at least some of the embodiments disclosed herein, a photovoltaic receiver can comprise a photo-sensitive device configured to convert sunlight into electrical energy. A first fin can comprise a first heat discharge portion configured to discharge heat energy through convective loss, a first base having a proximal portion connected to the first heat discharge portion and extending at an angle transverse to the first heat discharge portion, the first base comprising an outer base surface facing away from the first heat discharge portion, a first distal portion and a first connector portion connected to the first distal portion and extending from the first distal portion at an angle transverse to the first distal portion, the first connector portion being configured for engagement with the second fin. A second fin can comprise a second heat discharge portion. The first connector portion can be engaged with the second heat discharge portion at a location spaced away from the plane and away from the first distal portion of the first base.

In accordance another embodiment, a heat sink assembly comprising a first fin which can comprise a first heat discharge portion configured to discharge heat energy through convective loss, a first base having a proximal portion connected to the first heat discharge portion and extending at an angle transverse to the first heat discharge portion, the first base comprising an outer base surface facing away from the first heat discharge portion, a first distal portion and a first connector portion connected to the first distal portion and extending from the first distal portion at an angle transverse to the first distal portion. A second fin can comprise a second heat discharge portion configured to discharge heat energy through convective loss, a second base having a proximal portion connected to the second heat discharge portion, the second base including a second outer base surface facing away from the second heat discharge portion, the first and second outer base surfaces being substantially aligned along a plane and thermally connected to the photo-sensitive device. The first connector portion can be engaged with the second heat discharge portion at a location spaced away from the plane and away from the first distal portion of the first base.

In accordance with yet another embodiment, a heat sink can comprise a plurality of J-shaped fin members, at least a plurality of the fin members comprising a heat rejection portion, a base portion and a connection portion, the heat rejection portion and at least a first portion of the connection portion extending generally parallel. Additionally, the heat sink can include mechanical connections between the connection portions and heat rejection portions of juxtaposed fin members at locations with the first portions disposed between the locations and the base portions.

BRIEF DESCRIPTION OF THE DRAWINGS

FIG. 11 is a schematic perspective view of a heat sink with a fin array in accordance with an embodiment.

DETAILED DESCRIPTION

Figure 1:
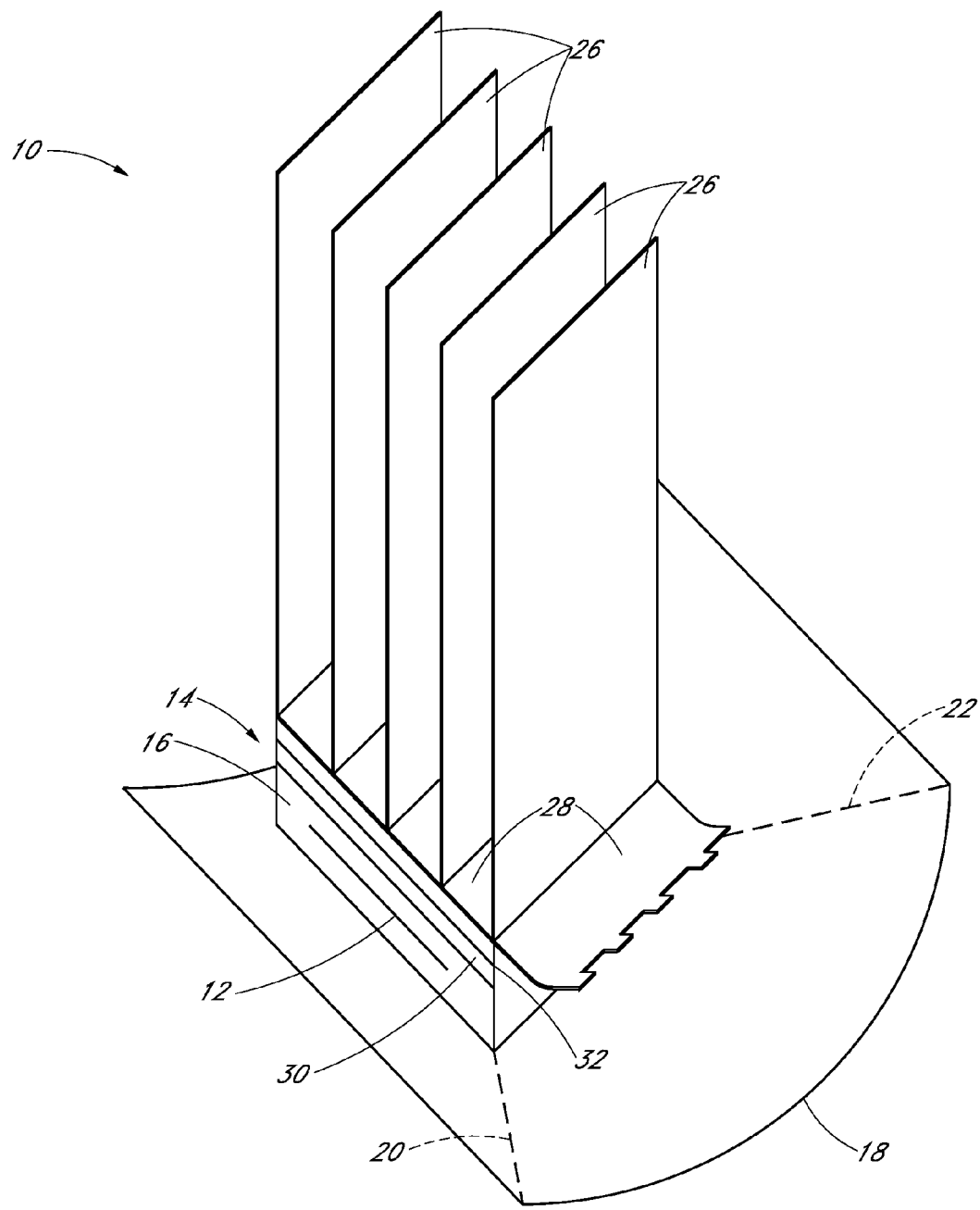
FIG. 1 is a schematic perspective view of a prior art solar collector assembly including a heat sink including a fin array thermally connected to a solar cell.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the proceeding technical field, background, brief summary, or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

TERMINOLOGY

The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" fin does not necessarily imply that this fin is the first fin in a sequence; instead the term "first" is used to differentiate this fin from another fin (e.g., a "second" fin).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments disclosed herein are described in the context of solar collection modules designed for concentrated solar collection systems because they have particular utility in this context. However, the embodiments disclosed herein can be used in other contexts as well, for example, including non-concentrated photovoltaic systems as well as any other device, such as an electronic device, which can benefit from cooling.

With reference to FIG. 1, some known solar energy collection devices 10 include a photosensitive device 12 configured to convert sunlight into electrical energy. For example, some such devices are in the form of photovoltaic cells 12. Photovoltaic cells 12 can be integrated into devices known as laminates 14 which are formed with photovoltaic cells 12 encapsulated in an encapsulate material 16. Together, the encapsulate 16 and the cells 12 form the laminate 14.

In some environments of use, the laminate 14 can be mounted in a predetermined position relative to a reflector 18 configured to concentrate solar energy onto the cells 12. The concentrated ray of sunlight is illustrated by the dashed lines 20 and 22.

In some known designs of concentrated photovoltaic receivers, one or more heat sinks 24 are thermally connected with the solar cells 12 and/or the laminate 14. For example, some known heat sink designs include a plurality of fins 26 attached to a common base assembly 28. The base assembly 28 also includes a base substrate 32, made of sheet metal for example, and is typically thermally connected to the laminate 14 using a layer of thermally conductive material 30. The substrate layer 32 can be formed from a piece of thermally conductive material, for example, the same material used for forming the fins 26, such as sheet metal. The substrate 32 provides a smooth and continuous base for transferring heat to the fins 26.

Figure 3:
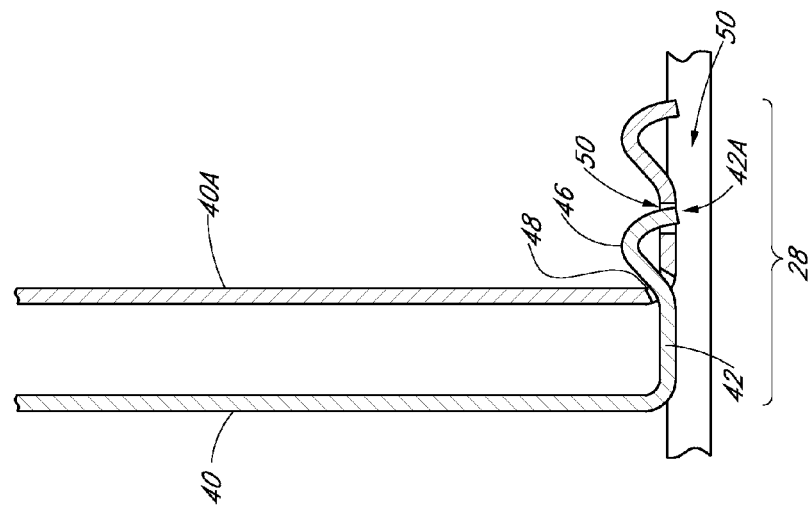
FIG. 3 is an enlarged side elevational and partial sectional view of the fin array illustrated in FIG. 2.
Figure 2:
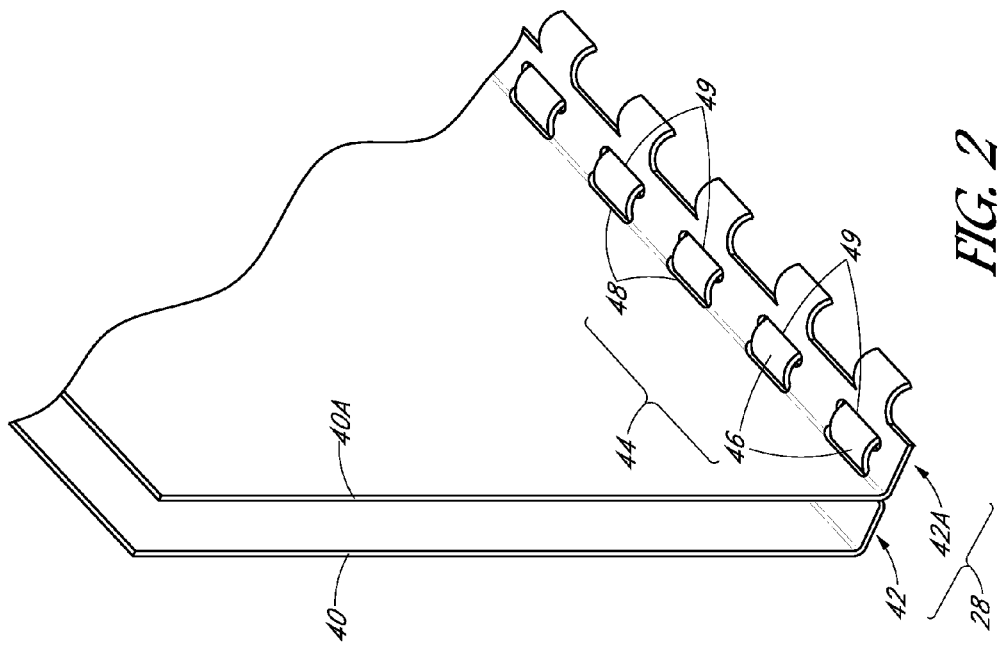
FIG. 2 is a schematic perspective view of interlocking engagement features included at a base of the fin array illustrated in FIG. 1.

With reference to FIGS. 2 and 3, some known designs for fin assemblies can include the lower ends that are stitched together or "zippered." For example, such known fin assemblies include an upper heat discharge portion 40 which forms the "fin" of the assembly 24. Each of these fins 40 can include a lower end forming a base 42 and a connecting assembly 44. The connecting assembly 44 can include a plurality of protrusions 46 aligned with and engaged with a plurality of apertures 48, 49 formed near the lower end of the fin 40 of an adjacent fin assembly 40A. The engagement of the protrusions 46 and the apertures 48, 49 form a mechanical engagement between adjacent fins 40, 40A.

The bases 42, 42A of the adjacent fins 40, 40A are generally aligned along a plane. A thermally conductive material 50 can be used to thermally connect the fins 40, 40A to a device for cooling purposes. Such thermally conductive materials 50 can be in the form of a viscous flowable liquid material that can be cured and used as an adhesive to form a bond between the bases 42, 42A and another device.

An aspect of at least one of the embodiments disclosed herein includes the realization that the protrusions 46 and apertures 49 used for mechanical engagement in the design illustrated in FIGS. 1-3 can cause partial discharge failures when such fin assemblies 24 are used in the context of heat sinks for photovoltaic receivers. For example, the surface defects (e.g., discontinuities) created by apertures 49 and tips of protrusions 46 along the plane of the downwardly facing surface of the base 42A have been found to be a cause of partial discharge failures. Those of ordinary skill in the art understand partial discharge failures (PD) to be a localized dielectric breakdown of a small portion of a solid or fluid electrical insulation system under high voltage stress, which does not bridge the space between two conductors. While a corona discharge is usually revealed by a relatively steady glow or brush discharge in air, partial discharges within solid insulation system are not visible. Partial discharge can occur in a gaseous, liquid or solid insulating medium and is known to often start within gas voids, such as voids in solid epoxy insulation or bubbles in transformer oil. Protracted partial discharge can erode solid insulation and eventually lead to breakdown of insulation.

Thus, in some known designs, as illustrated in FIG. 1 above, an additional substrate layer 32 is added to provide a metal to metal contact of the adjacent bases 42, 42A with the additional metal layer 32. Then, the layer 32 is connected to the laminate 14 with a thermally conductive material layer 30. While this design avoids the problems of partial discharge failures associated with the arrangement illustrated in FIG. 3, the additional metallic layer adds to the cost and manufacturing complexity of such a heat sink.

A further aspect of at least some of the embodiments disclosed herein includes the realization that the non-uniformities resulting from the zippered design of the known heat sinks illustrated in FIGS. 2 and 3 can be avoided with a different configuration of the fins 26.

Figure 4:
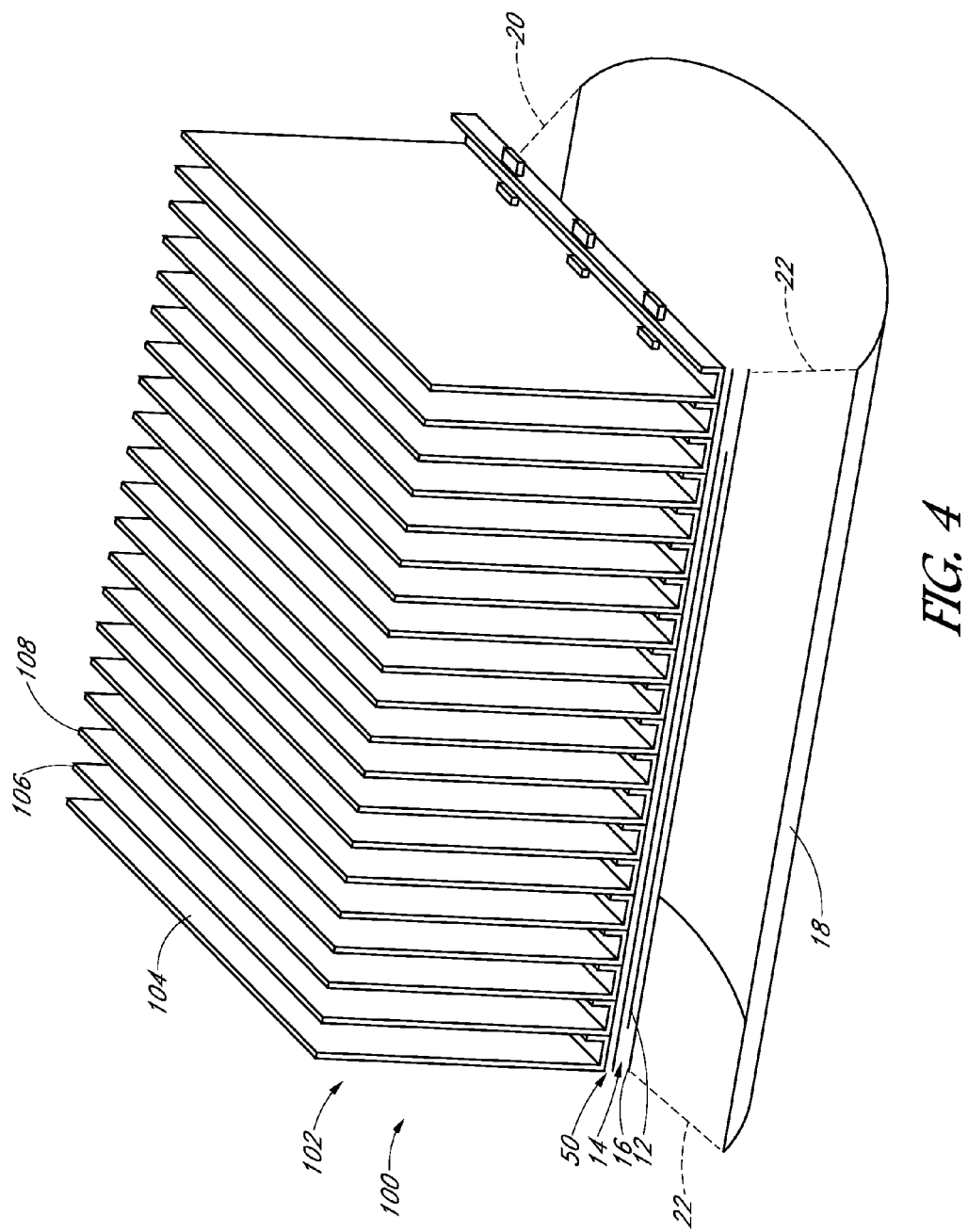
FIG. 4 is a schematic perspective view of a photovoltaic solar receiver including a heat sink with a fin array in accordance with an embodiment.
Figure 6:
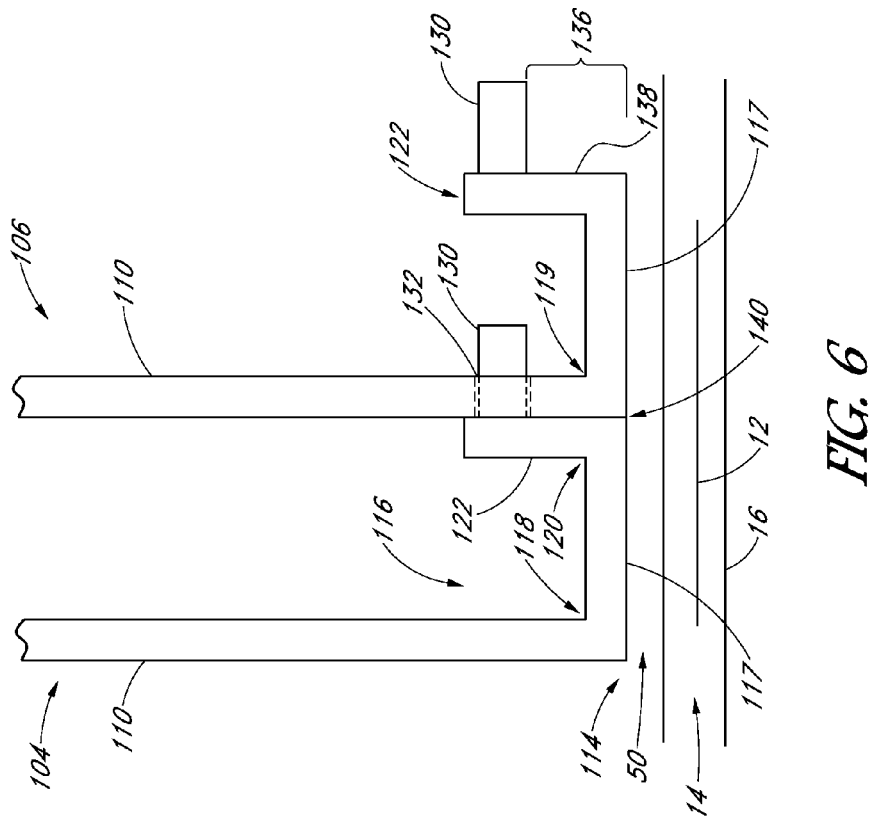
FIG. 6 is an enlarged schematic side elevational view of inter fin engagement features included in the fin array of FIGS. 4 and 5.
Figure 5:
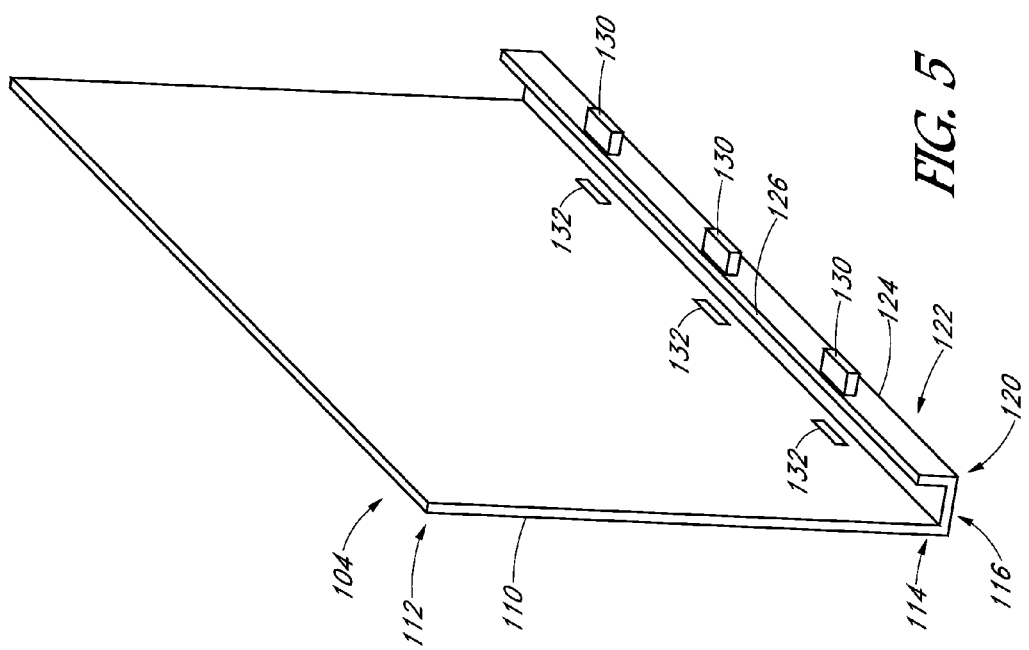
FIG. 5 is a schematic perspective view of one of the fins included in the solar receiver of FIG. 4.

With reference to FIGS. 4-6, an embodiment of a solar energy collector 100 is illustrated therein. The solar energy collector 100 can include, as described above with reference to FIG. 1, a reflector 18 configured to concentrate sunlight onto one or a plurality of photovoltaic cells 12 disposed within an encapsulate material 16 forming a photovoltaic laminate 14. The laminate 14 can be thermally connected, so as to provide thermal communication, through a portion of a heat sink assembly 102, described in greater detail below.

Continued reference to FIGS. 4-6, the heat sink assembly 102 can include a plurality of fin members 104, 106, 108, etc. The laminate 14 can be any length and any number of fin members 104, 106, 108 can be included in the assembly 102 to provide the desired heat rejection performance. Although only two fin members 104, 106 are described in detail below, a heat sink assembly 102 can include any number of fin members 104, 106 which can have a similar or identical construction.

With reference to FIG. 5, the fin member 104 can include a heat discharge portion 110. The heat discharge portion 110 can be made from a generally planar piece of thermally conductive material which exhibits or possesses the ability to discharge heat through convective loss. As such, the laminate 14, and thus the photovoltaic cells 12 disposed therein, can be in thermal communication with the bases 116, and thereby allow heat from the photovoltaic cells 12 to be discharged from the photovoltaic cells 12, through the bases 116 and through the heat discharge portions 110 of the fin members 104, 106.

The thermal discharge portion 110 can be considered as including a distal portion 112 and a proximate portion 114. In the illustrated embodiment, the distal portion 112 can be the free edge of the heat discharge portion 110. The proximate portion 114 can be considered the portion proximate to a base 116 of the fin member.

The base 116 can include a proximate portion 118 connected to the proximate portion 114 of the heat discharge portion 110. Additionally, the base portion 116 can include a distal portion 120 disposed at an opposite end of the base portion 116. Additionally, the fin member 104 can include a connection portion 122 which can include a proximate portion 124 connected to the distal portion 120 of the base portion 116 and the distal portion 126 disposed at an upper end of the connection portion 122. In the illustrated embodiment, the heat discharge portion 110, base 116 and connection portion 122 can be made from a single piece of bent sheet metal, which optionally can be a single monolithic part. However, other configurations can also be used.

Figure 9:
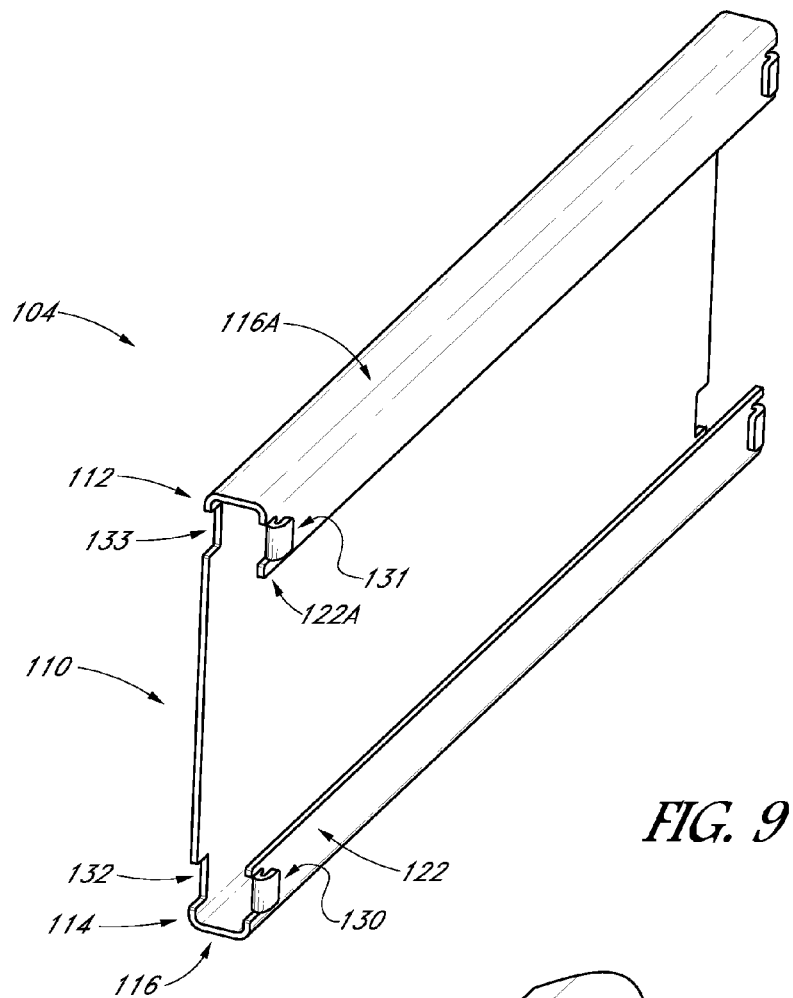
FIGS. 9 and 10 are schematic perspective views of an example fin in accordance with an embodiment.
Figure 10:
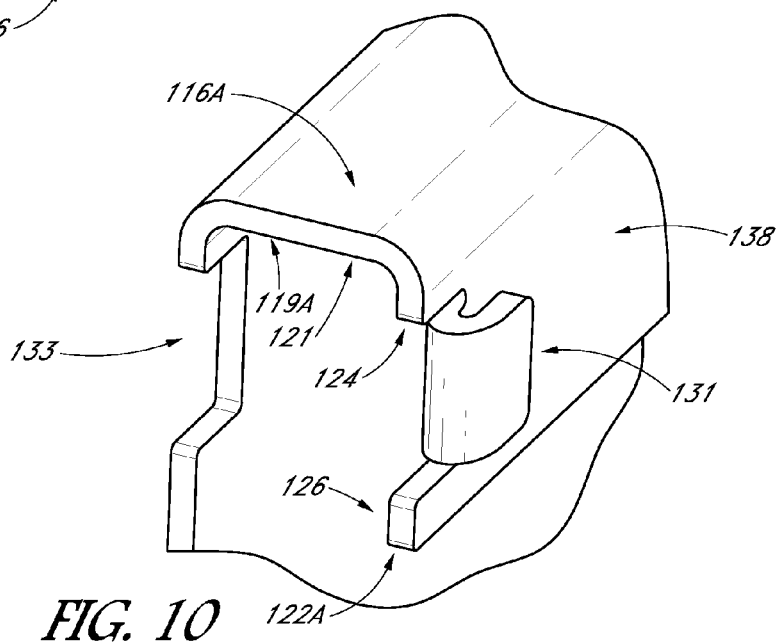

Optionally, the connection portion 122 can be configured to mechanically engage with an adjacent fin member for example, fin member 106. Thus, in some embodiments, the connection portion 122 includes a plurality of projections 130. The plurality of projections can be sized and arranged to engage with apertures 132 disposed on a heat discharge portion 110 of an adjacent fin member 106. As such, the projections 130 and apertures 132 can be considered as forming a mechanically engaged connection between the adjacent fin members 104, 106. In some embodiments, the projections 130 can be bent or include other features for creating a mechanical interlock with an adjacent fin member, for example, as shown in FIGS. 9-11. Other connections, including mechanically engaged connections, can also be used.

In some embodiments, the components forming the connection between the adjacent fin members 106, 104, such as the projections 130 and apertures 132, can be at a location spaced upwardly from the outer base surface 117 of the base portion 116. In the illustrated embodiment, the projection 130 is spaced from the outer base surface 117 by a spacing 136. In some embodiments, the spacing 136 can be approximately two millimeters, at least 2 mm, or other spacings 136 that are smaller, such as 0.1 mm, 1 mm or larger such as 3 mm, 4 mm, 5 mm, etc.

Additionally, as illustrated in FIG. 6, with the projections 130 and apertures 132 spaced away from the outer base surface 117, an outwardly facing surface 138 of the connector portion 122 is disposed between the projection 130 and the outer base surface 117. The outer surface 138 of the connector portion 122 extends generally parallel to the heat discharge portions 110. As such, portions of the outer surface 138 of the connector portion 122 and an outer surface of the heat discharge portions 110 can lie flatly against each other and thus provide a more continuous surface contour there between and in particular, in the vicinity of the abutment 140 of these two surfaces. As such, the surface irregularities in the vicinity of the outer base surface 117 caused by the zippered configuration of the collectors of FIGS. 1-3 can be avoided. Further, by reducing or eliminating the surface irregularities of FIGS. 1-3, partial discharge failure can be further reduced or eliminated and thus, the need for the additional metallic layer 32 described above with reference to FIG. 1 can also be eliminated.

Referring now to FIGS. 9-11, in some embodiments, the projections 130 can be bent or include other features for creating a mechanical interlock with an adjacent fin member as mentioned above. Unless stated otherwise, the description of components shown in FIGS. 4-6 having like numbers as components in FIGS. 9-11 applies equally to the components in FIGS. 9-11. As shown in FIGS. 9 and 10, the projections 130 can include a curved body that curves generally in a direction away from the outer surface 138 of the connector portion 122 and then back in a direction substantially parallel to the surface 138 such that the projection 130 is configured to interlock onto an aperture 132 of an adjacent fin.

As shown in the example of FIGS. 9-11, the distal portion 112 can include an upper connection portion 122A. In some embodiments, similar to the base 116 of the proximate portion 114, the distal portion 112 can include a top 116A. The top 116A can include a proximate portion 119A connected to the distal portion 112 of the heat discharge portion 110. Additionally, the top portion 116A can include a distal portion 121 disposed at an opposite end of the top portion 116A. Additionally, the upper connection portion 122A can include a proximate portion 124 connected to the distal portion 121 of the top portion 116A and a distal portion 126 disposed at a lower end of the upper connection portion 122A. Optionally, the upper connection portion 122A can include one or more projections 131 and optionally one or more projections 131 at each longitudinal end of the connector portion 122. The projections 131 can include a curved body that curves generally in a direction away from the outer surface 138A of the upper connector portion 122A and then back in a direction substantially parallel to the surface 138A such that the projection 131 is configured to interlock onto an aperture 133 of an adjacent fin. In the illustrated embodiment, the heat discharge portion 110, base 116, top 117 and connection portions 122, 122A can be made from a single piece of bent sheet metal, which optionally can be a single monolithic part. However, other configurations can also be used.

Referring again to FIGS. 4-6 but applying equally to FIGS. 9-11, in some embodiments, the thermally conductive material 50 can be disposed in the vicinity of the abutment 140, for example, so as to be disposed directly between portions of the adjacent fin members 104, 106. In some embodiments, the thermally conductive material 50 can be disposed directly between the distal portion 120 of the base 116 of the fin member 104 and the proximate portion 119 of the base of the fin member 106.

Further, in some embodiments, the thermally conductive material 50 is not disposed at the location of the engagement of the projections 130 and the apertures 132. In such embodiments, the thermally conductive material 50 can be considered as not being direct contact with the location of the engagement of the projectiles 130 and the apertures 132.

As such, the solar energy receiver 100 can be manufactured with lower costs and with reduced tendency for partial discharge failure.

Figure 7:
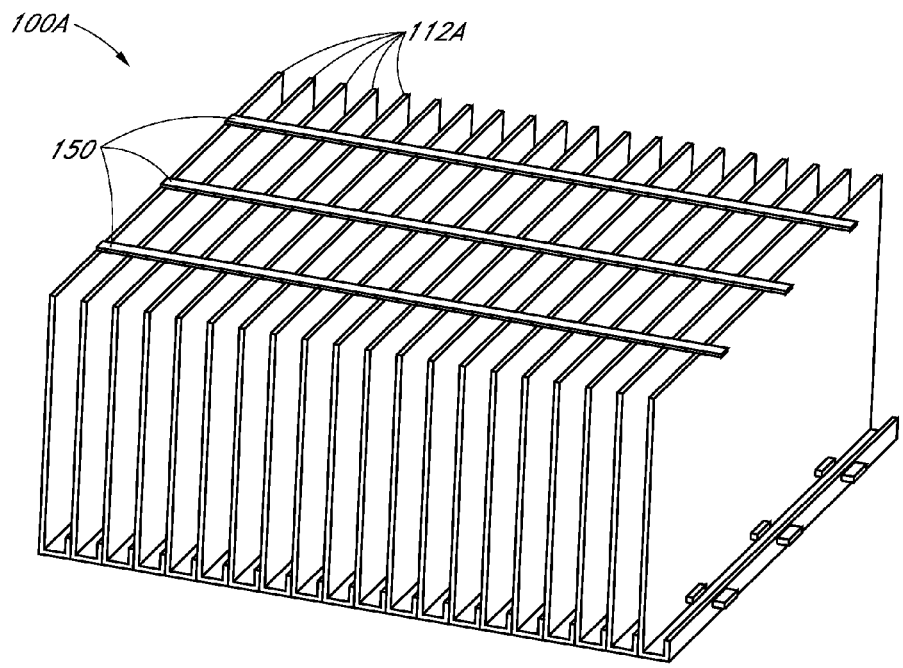
FIG. 7 is a schematic perspective view of another embodiment of the PV receiver of FIG. 4.

FIG. 7 illustrates a modification of the solar energy receiver 100 and is identified generally by the reference numeral 100A. Components of the receiver 100A that are similar or the same as the receiver 100 are identified with the same reference numeral, except that a letter "A" has been added thereto.

With continued reference to FIG. 7, the receiver 100A can include one or a plurality of additional reinforcing members 150 extending along the upper free edges 112A of corresponding fins. The reinforcing members 150 can be engaged with recesses formed in the free edge 112A and either bonded, welded, or otherwise attached to the free edges 112A so as to provide further rigidity and resistance against bending of the fins relative to each other.

In one embodiment, the reinforcing member 150 can be electrically conductive. As one example, the reinforcing member can be a continuous conductive ribbon (e.g., aluminum ribbon) that extends continuously along the upper edges (e.g., tops or free edges) of corresponding fins. In one embodiment, the conductive reinforcing member can be laser welded on the edges of the fins to create weld points as electrical contacts.

Figure 8:
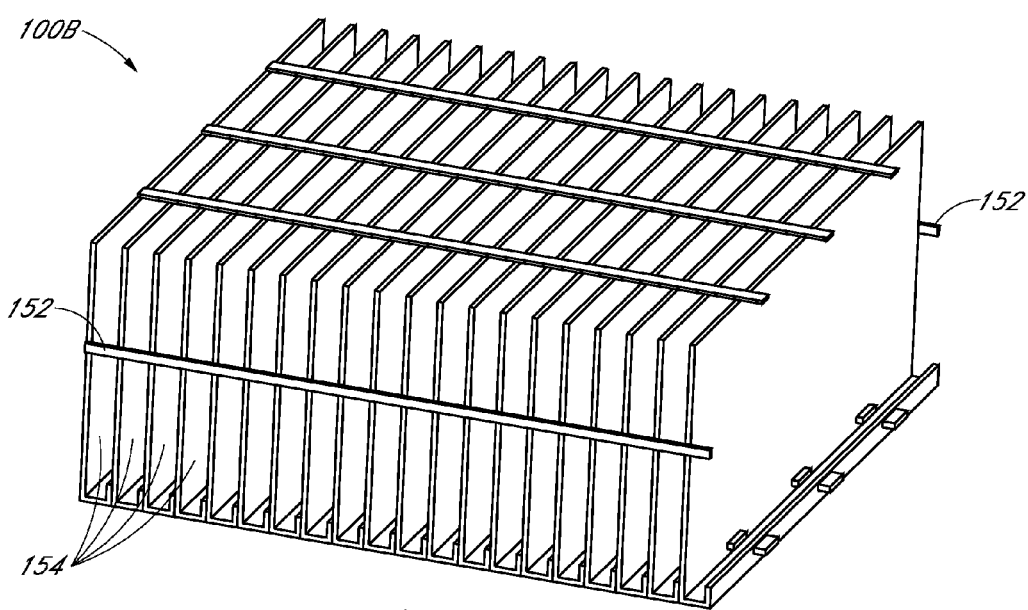
FIG. 8 is a schematic perspective view of yet another embodiment of the PV receiver illustrated in FIG. 4.

FIG. 8 illustrates a further modification of the solar energy receiver 100, identified generally by the reference numeral 100B. The components of the receiver 100B that are similar or the same as the components of the receiver 100 or 100A described above are identified with the same reference numerals except that a letter "B" has been added thereto.

With continued reference to FIG. 8, the receiver 100B can include an additional reinforcing member 152 engaged with a plurality of lateral edges 154 of adjacent fins of the receiver 100B. Similarly to the reinforcing members 150 of the receiver 100A, the reinforcing members 152 can be received within recesses (not shown) disposed along the free edges 154.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A photovoltaic receiver comprising:
a photo-sensitive device configured to convert sunlight into electrical energy;
a first fin comprising a first heat discharge portion configured to discharge heat energy through convective loss, a first base having a proximal portion connected to the first heat discharge portion and extending at an angle transverse to the first heat discharge portion, the first base comprising a first outer base surface facing away from the first heat discharge portion, a first distal portion and a first connector portion connected to the first distal portion and extending from the first distal portion at an angle transverse to the first distal portion; and a second fin comprising a second heat discharge portion configured to discharge heat energy through convective loss, a second base having a proximal portion connected to the second heat discharge portion, the second base including a second outer base surface facing away from the second heat discharge portion, the first and second outer base surfaces being substantially aligned along a plane and thermally connected to the photo-sensitive device, wherein the first connector portion is engaged with the second heat discharge portion at a location spaced away from the plane and away from the first distal portion of the first base, wherein the first connector portion comprises a plurality of projections extending from the distal portion of the first connector portion.

2. The receiver according to claim 1, wherein the photo-sensitive device comprises a plurality of photovoltaic cells encased within an encapsulant material, the first and second outer base surfaces being thermally connected to an outer surface of the encapsulant material.

3. The receiver according to claim 1, wherein the first connector portion comprises a proximal portion connected to the distal portion of the first base and a distal portion, wherein the location is disposed at the distal portion of the first connector portion.

4. The receiver according to claim 1, wherein the second heat discharge portion comprises a plurality of apertures disposed on the second heat discharge portion at a second location spaced away from the plane and engaged with the plurality of projections.

5. The receiver according to claim 1, wherein the location is spaced away from the plane by at least 2 mm.

6. The receiver according to claim 5, additionally comprising a thermally conductive material disposed between the plane and the photo-sensitive device.

7. The receiver according to claim 6, wherein at least a portion of the thermally conductive material is disposed directly between the first and second bases.

8. The receiver according to claim 7, wherein the thermally conductive material is not in direct contact with the location.

9. The receiver according to claim 1, wherein the first connector portion comprises a planar portion extending parallel to the second heat discharge portion, the location being on the planar portion of the first connector portion.

10. The receiver according to claim 9, wherein at least a first portion of the planar portion is disposed between the distal portion of the first base and the location.

11. A heat sink assembly comprising;
a first fin comprising a first heat discharge portion configured to discharge heat energy through convective loss, a first base having a proximal portion connected to the first heat discharge portion and extending at an angle transverse to the first heat discharge portion, the first base comprising an outer base surface facing away from the first heat discharge portion, a first distal portion and a first connector portion connected to the first distal portion and extending from the first distal portion at an angle transverse to the first distal portion; and a second fin comprising a second heat discharge portion configured to discharge heat energy through convective loss, a second base having a proximal portion connected to the second heat discharge portion, the second base including a second outer base surface facing away from the second heat discharge portion, the first and second outer base surfaces being substantially aligned along a plane and configured to be thermally connected to a photo-sensitive device;

wherein the first connector portion is engaged with the second heat discharge portion at a location spaced away from the plane and away from the first distal portion of the first base, wherein the first connector portion comprises a plurality of projections extending from the distal portion of the first connector portion.

12. The assembly according to claim 11, wherein the first connector portion comprises a proximal portion connected to the distal portion of the first base and a distal portion, wherein the location is disposed at the distal portion of the first connector portion.

13. The assembly according to claim 11, wherein the second heat discharge portion comprises a plurality of apertures disposed on the second heat discharge portion at a second location spaced away from the plane and engaged with the plurality of projections.

14. The assembly according to claim 11, wherein the location is spaced away from the plane by at least 2 mm.

15. The assembly according to claim 11, wherein the first connector portion comprises a planar portion extending parallel to the second heat discharge portion, the location being on the planar portion of the first connector portion.

16. The assembly according to claim 15, wherein at least a first portion of the planar portion is disposed between the distal portion of the first base and the location.

17. The assembly according to claim 11, in combination with a laminate comprising a photovoltaic cell and encapsulant material in thermal communication with the first and second bases.

* * * * *